US012655521B2

(12) United States Patent
Olsen et al.

(10) Patent No.: US 12,655,521 B2
(45) Date of Patent: Jun. 16, 2026

(54) INJECTION MODULE FOR A PROCESS CHAMBER

(71) Applicant: Applied Materials, Inc., Santa Clara, CA (US)

(72) Inventors: Christopher S. Olsen, Fremont, CA (US); Kartik Bhupendra Shah, Saratoga, CA (US); Chaitanya Anjaneyalu Prasad, Cupertino, CA (US); Vishwas Kumar Pandey, Madhya Pradesh (IN); Anilkumar Bodepudi, Bangalore (IN); Erika Hansen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 619 days.

(21) Appl. No.: 17/968,561

(22) Filed: Oct. 18, 2022

(65) Prior Publication Data

US 2023/0133402 A1    May 4, 2023

(30) Foreign Application Priority Data

Nov. 3, 2021    (IN) .............................. 202141050502

(51) Int. Cl.
*C23C 16/455* (2006.01)
*C23C 16/458* (2006.01)
*C23C 16/52* (2006.01)

(52) U.S. Cl.
CPC .... *C23C 16/45563* (2013.01); *C23C 16/4584* (2013.01); *C23C 16/52* (2013.01)

(58) Field of Classification Search
CPC .............. C23C 16/45563; C23C 16/52; C23C 16/4584; C23C 16/45574; H01J 37/3244; H01J 37/32449
See application file for complete search history.

(56) References Cited

U.S. PATENT DOCUMENTS 6,450,116 B1    9/2002 Noble et al.
10,760,161 B2    9/2020 Lau et al.
(Continued)

FOREIGN PATENT DOCUMENTS

KR    20170095749 A    8/2017
TW    I493073 B    7/2015
(Continued)

OTHER PUBLICATIONS

International Search Report and Written Opinion dated Feb. 17, 2023 for Application No. PCT/US2022/046954.
(Continued)

*Primary Examiner* — Joseph A Miller, Jr.
(74) *Attorney, Agent, or Firm* — Patterson + Sheridan, LLP

(57) ABSTRACT

The present disclosure relates to a gas injection module for a process chamber. The process chamber includes a chamber body, a rotatable substrate support disposed inside a process volume of the chamber body, the substrate support configured to have a rotational spin rate; an inlet port formed in the chamber body, and an injection module coupled to the inlet port. The injection module includes a body, one or more gas inlets coupled to the body, and a plurality of nozzles formed in a supply face of the body, the supply face configured to face inside the chamber body, and gas exiting from the injection module is configured to have a flow rate; the process chamber also includes a controller configured to operate the process chamber such that the ratio of the flow rate to the rotational spin rate is between about ⅓ and 3.

20 Claims, 5 Drawing Sheets

(56)        References Cited

U.S. PATENT DOCUMENTS

| | | | | |
|---|---|---|---|---|
| 2003/0049372 A1* | 3/2003 | Cook | ............... | H01L 21/67069 |
| | | | | 118/724 |
| 2004/0238008 A1 | 12/2004 | Savas et al. | | |
| 2005/0178336 A1* | 8/2005 | Liu | ................... | C23C 16/45508 |
| | | | | 118/728 |
| 2014/0137801 A1* | 5/2014 | Lau | ........................ | C30B 25/14 |
| | | | | 118/728 |
| 2015/0152991 A1* | 6/2015 | Lin | ........................ | C30B 25/14 |
| | | | | 137/334 |
| 2019/0330741 A1 | 10/2019 | Lee et al. | | |
| 2020/0258718 A1 | 8/2020 | Wang et al. | | |

FOREIGN PATENT DOCUMENTS

| | | | |
|---|---|---|---|
| TW | I582263 | B | 5/2017 |
| TW | I594351 | B | 8/2017 |
| TW | 201738964 | A | 11/2017 |
| TW | I628729 | B | 7/2018 |
| WO | 2019044440 | A1 | 3/2019 |

OTHER PUBLICATIONS

Office Action from South Korean Patent Application No. 10-2024-7018107 dated Dec. 17, 2025.
Taiwanese Office Action for Application No. 111140405 dated Feb. 26, 2026.

* cited by examiner

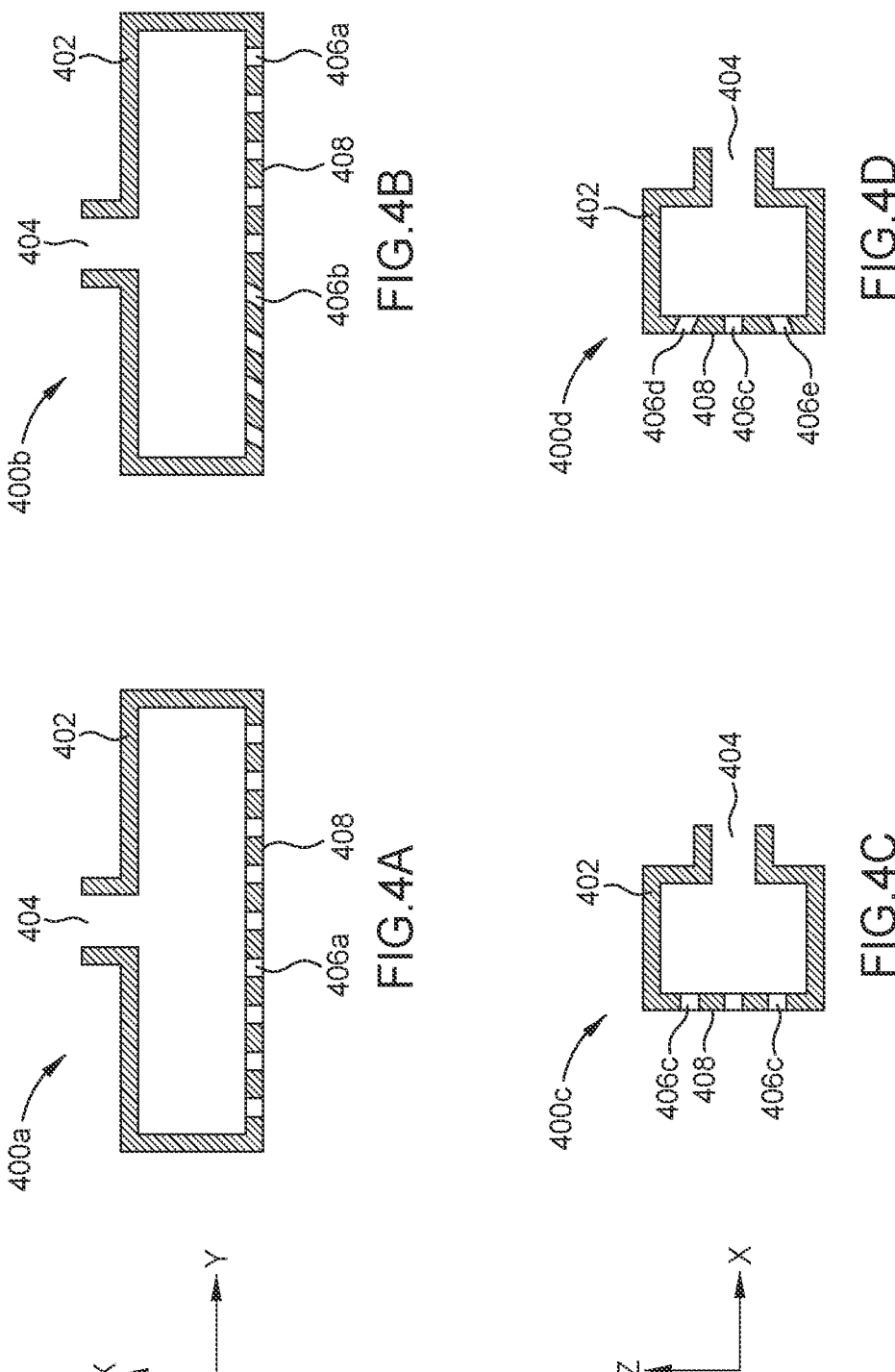

INJECTION MODULE FOR A PROCESS CHAMBER

BACKGROUND

Field

The present disclosure generally relates to thin film materials, in particular the deposition, modification, or removal of thin film materials on a substrate, such as a semiconductor substrate. More particularly, the present disclosure relates to a gas injection module for a process chamber, such as a rapid thermal processing (RTP) process chamber.

Description of the Related Art

The deposition of, modification of, or removal of thin film materials on a substrate depends in large part on flux of precursor gases across the surface of the substrate. During substrate rotation, rotational velocity (i.e., rotational spin rate) often dominates over precursor gas flow rate within the process chamber. Especially at process volume pressure ranges of about 100 Torr or more, low relative gas flow rate (in comparison to rotational spin rate) may cause low flux at the center of the substrate. The area of low flux at the center of the substrate may be referred to as a "stagnation region." In some examples, such as radical oxidation, relatively low growth of oxide thin film occurring in the stagnation region at the center of the substrate (compared to the edge region) may lead to undesirably high film thickness non-uniformity across the surface of the substrate. Therefore, there is a need for apparatus and methods that improve precursor gas flux across the surface of the substrate.

SUMMARY

In some embodiments, a process chamber suitable for use in semiconductor manufacturing is provided. The process chamber includes a chamber body, a rotatable substrate support disposed inside a process volume of the chamber body, the substrate support configured to have a rotational spin rate; an inlet port formed in the chamber body, and an injection module coupled to the inlet port. The injection module includes a body, one or more gas inlets coupled to the body, and a plurality of nozzles formed in a supply face of the body, the supply face configured to face inside the chamber body, and gas exiting from the injection module configured to have a flow rate. The process chamber also includes a controller configured to operate the process chamber such that the ratio of the flow rate to the rotational spin rate is between about ⅓ and 3.

In some embodiments, a process chamber is provided. The process chamber includes a chamber body, a rotatable substrate support disposed inside the chamber body; an inlet port formed in the chamber body, and an injection module coupled to the inlet port. The injection module includes a body, one or more gas inlets coupled to the body, and a plurality of nozzles formed in a supply face of the body, the supply face configured to face inside the chamber body, wherein the supply face has a void area with a larger spacing between proximate adjacent nozzles compared to spacing between other adjacent pairs of nozzles of the plurality of nozzles.

In some embodiments, a process chamber is provided. The process chamber includes a chamber body, a rotatable substrate support disposed inside a process volume of the chamber body, an inlet port formed in the chamber body, and an injection module coupled to the inlet port. The injection module includes two or more body portions; for each adjacent pair of the two or more body portions, a vertical partition separating the adjacent body portions; for each of the two or more body portions, a gas inlet coupled to the corresponding body portion, and to a gas conduit coupled to the corresponding gas inlet; and for each of the two or more body portions, a plurality of nozzles formed in a supply face of the corresponding body portion.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the disclosure and are therefore not to be considered limiting of its scope, as the disclosure may admit to other equally effective embodiments.

FIGS. 4A-4D are cross-sectional views of various injection modules that may be used in the process chamber of FIG. 1, according to examples of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to a gas injection module for a process chamber having a process volume pressure range of about 100 Torr or more. The injection module may beneficially increase gas flux across one or more regions of the surface of a substrate. The injection module may beneficially increase relative gas flow rate, as compared to rotational spin rate. The injection module may beneficially improve gas flow directionality, as compared to conventional chamber designs. The injection module may enable greater reaction uniformity and/or tunability across one or more regions of the surface of a substrate disposed in the process chamber.

Injection module embodiments of the present disclosure provide increased relative gas flow rate and improved gas flow directionality compared to previous gas injection modules or showerhead designs. The provided gas flow rate may match or exceed the rotational spin rate of the substrate support within the process chamber. The provided gas flow rate and directionality may enable displacement of gas from the stagnation region at or near the center of the substrate. Improved displacement of gas from the stagnation region may increase reactivity proximate the center of the substrate, thereby improving center-to-edge (C-E) reaction uniformity.

In one example, the gas flow rate is about 0.5 times to about 2.0 times the rotational spin rate of the substrate support at the perimeter thereof. In one example, the perimeter of the substrate support is approximately at the extent of the diameter of the substrate support which supports the substrate. In one example, the gas flow rate may be greater than about 0.1 meters per second (m/s) and less than about 6 m/s, depending on the rotational spin rate of the substrate support, the process volume pressure, and the size of the substrate. In another embodiment, the gas flow rate may be greater than about 6 m/s. In other embodiments, the substrate may be a 200 mm wafer, a 300 mm wafer or a 450 mm wafer. For example, for a 200 mm, 300 mm, and 450 mm wafer, the gas flow rate may be between about 0.3 m/s and about 2.6 m/s, between about 0.4 m/s and about 3.8 m/s, and between about 0.7 m/s and about 5.7 m/s, respectively.

Injection module embodiments of the present disclosure may enable improved control of gas flow distribution and/or directionality within the process chamber compared to previous gas injection modules or showerhead designs. The rate, distribution, and/or directionality of gas flow may be adjustable, which thereby may improve gas flux and reaction uniformity.

Figure 1:
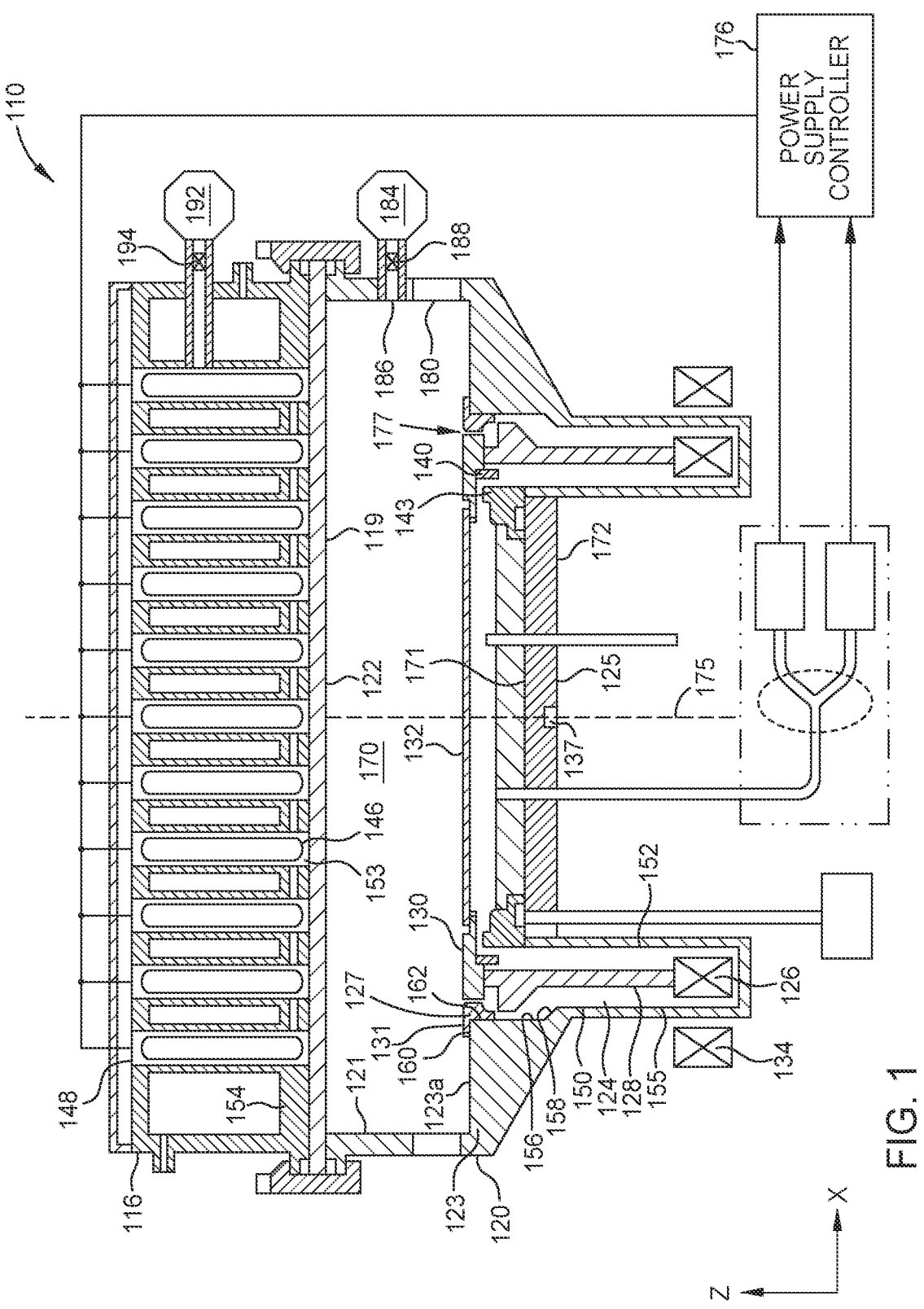
FIG. 1 is a cross-sectional view of a process chamber, according to some embodiments.

FIG. 1 is a cross-sectional view of an exemplary process chamber 110 that may be used to practice the methods set forth herein. As shown in FIG. 1, the process chamber 110 is a rapid thermal processing (RTP) chamber, although other types of chambers may be used. In general, the process chamber 110 holds a substrate 132 for processing in a gaseous environment according to examples of the present disclosure.

In general, the process chamber 110 is configured to receive the substrate 132 therein and rotate the substrate 132 while receiving energy into the process chamber 110 to heat the substrate 132 to an elevated temperature. The elevated temperature of the substrate 132 results in a faster reaction rate of reactant species introduced into the process chamber 110 with the substrate 132 or portions of a thin film material layer on the substrate 132. In some examples, the substrate 132 may be a semiconductor substrate (e.g., formed from silicon). As shown in FIG. 1, the substrate 132 is supported on an edge ring 130. The edge ring 130 is disposed on a substrate support 128. In other embodiments, it is contemplated that the substrate 132 is directly supported on the substrate support 128. The substrate support 128 is coupled to a rotor 126. The rotor 126 may be annular, as shown in FIG. 1. The rotor 126 is configured to rotate the substrate 132 about a center axis 175 of the rotor 126, to allow uniform heating of the substrate 132 via the energy source of the process chamber 110. The rotor 126 may be configured to rotate the substrate 132 at a rotational spin rate of greater than or equal to about 0.5 Hertz, such as about 2 Hertz or greater, such as about 4 Hertz or greater.

Process chamber 110 may have a process volume pressure range of about 100 Torr or more. It is currently believed that, for chambers operating at process volume pressure ranges of about 100 Torr to about 600 Torr, and with substrate rotational frequency of greater than or equal to about 2 Hertz, the rotational convective drag forces spin-up the gas velocity near 1-2 m/s. It is also currently believed that such convective drag forces impede migration of fresh reactants to the center of the substrate. The process chamber 110 includes a chamber body 120 having a sidewall portion 121 and a lower portion 123. A window 122 is disposed on the sidewall portion 121 of the chamber body 120, such that a process volume 170 is formed between the window 122 and the substrate support 128. In some examples, the window 122 may be transparent to electromagnetic energy. A rapid annealing lamp assembly 116 is disposed over the window 122. In one embodiment, which can be combined with other embodiments disclosed herein, the lamp assembly 116 is less than or equal to about 3 centimeters (cm) from the substrate support, such as about 2 cm or less above the substrate support. The lamp assembly 116 includes a housing 154 and a plurality of lamps 146, disposed in the housing 154. Each lamp 146 is disposed within a corresponding opening 153 in the housing 154. The lamps 146 are connected to a power supply controller 176 via a plurality of electrical sockets 148 (e.g., one socket 148 for each lamp 146). During operation, the lamps 146 emit radiation through the window 122 towards the substrate 132 disposed in the process chamber 110 to heat the substrate 132 to a predetermined temperature. In some examples, the predetermined temperature may be within a range of about 20° C. to about 1,500° C., such as about 200° C. to about 1,300° C.

In some examples, the window 122 may be formed from a material resistant to the processing environment (e.g., a material that maintains rigidity when exposed to elevated temperatures and/or a material that is transparent to radiation emitted by the lamps 146). In some examples, the window 122 may be formed from quartz or sapphire. In some examples, the window 122 may be coated with an anti-reflective coating. As shown in FIG. 1, a filter 119 is coated on an inside surface of the window 122 (i.e. facing the substrate support 128, as shown). In some examples, one or more filters may be disposed on one or both sides of the window 122. In some examples, if the lamps 146 have significant ultraviolet (UV) light output, one or more UV filters may be used to limit or prevent the transmission of UV ions and/or radicals from the lamps 146 into the process chamber 110 to reduce UV damage to UV sensitive structures on the substrate 132. In some examples, one or more notch filters may be used to admit narrow band radiation.

In some embodiments, the filter 119 blocks radiation at wavelengths within a specific range of about 780 nm to about 880 nm, while transmitting radiation at wavelengths outside the specific range. In some examples, the filter 119 may be formed from a plurality of alternating layers, such as alternating oxide layers. In some examples, the filter 119 may include alternating silicon dioxide layers and titanium dioxide layers with the silicon dioxide layers being located at opposite ends of the filter 119. In some examples, the filter 119 may include 30 to 50 alternating layers. In some examples, the filter 119 may be coated onto an outside surface of the window 122 (i.e., facing the lamp assembly 116), coated onto an inside surface of the window 122 (i.e., facing the substrate support 128, as shown), or embedded in the window 122.

An inlet port 180 and an outlet port (e.g., 182 in FIG. 2A) are formed in the sidewall portion 121 of the chamber body 120. In some examples, operating pressure within the process chamber 110 may be reduced to a sub-atmospheric pressure before introducing a process gas through the inlet port 180. A vacuum pump 184 (shown schematically in FIG. 1) evacuates the process chamber 110 by pumping gas from the interior of the process chamber 110 through an exhaust port 186 formed in the sidewall portion 121 of the chamber body 120. A valve 188 disposed between the exhaust port 186 and the vacuum pump 184 is utilized to control the pressure within the process chamber 110. In some other examples, the process chamber 110 may be operated with process volume pressure in the range of about 100 Torr or more, for example, from about 100 Torr to about 600 Torr. A second vacuum pump 192 (shown schematically in FIG. 1) is connected to the lamp assembly 116 to reduce the pressure within the lamp assembly 116, particularly when the pressure within the process chamber 110 is pumped to a reduced pressure to reduce the pressure differential across the window 122. The pressure within the lamp assembly 116 is controlled by a valve 194.

An annular channel 124 is formed in the chamber body 120. The channel 124 is located adjacent the lower portion 123 of the chamber body 120. The rotor 126 and the substrate support 128 are disposed in the channel 124. As shown in FIG. 1, the substrate support 128 is a cylinder. In some examples, the substrate support 128 is formed from a material having high heat resistivity (e.g., black quartz). The edge ring 130 is disposed on the rotatable substrate support 128 and may be in contact with the substrate 132. As shown in FIG. 1, a plane of the edge ring 130 is parallel to the X-Y plane (horizontal). A rotor cover 127 is disposed on the lower portion 123 of the chamber body 120 outside the edge ring 130. The channel 124 has an outer wall 150 (i.e. radially outward relative to an inner wall 152) and the inner wall 152. A lower portion 155 of the outer wall 150 has a first radius and an upper portion 156 of the outer wall 150 has a second radius greater than the first radius. A middle portion 158 of the outer wall 150 connecting the lower portion 155 to the upper portion 156 extends linearly therebetween, forming a slanted surface that faces toward the edge ring 130. The rotor cover 127 has a first portion 160 that rests on an upper surface 123*a* of the lower portion 123 of the chamber body 120 and a second portion 162 that extends into the channel 124 along the upper portion 156 of the outer wall 150. The rotor cover 127 extends partially over an opening 177 the channel 124 to prevent deposition or buildup of particles caused by the flow of precursor gas into the process chamber 110. As shown in FIG. 1, the rotor cover 127 is an annular ring. In some examples, the rotor cover 127 may be formed from a ceramic material (e.g., alumina). The rotor cover 127 includes a first surface 131 facing the window 122. As shown in FIG. 1, the first surface 131 is parallel to the window 122 to prevent the reflection of radiant energy towards the substrate 132. In some other examples, the first surface 131 may be slanted downwards from outside to inside (i.e., radially inward). In other examples, the first surface 131 may be slanted downwards from inside to outside (i.e., radially outward).

A stator 134 is located external to the chamber body 120 in a position axially aligned with the rotor 126. In some embodiments, the stator 134 is a magnetic stator, and the rotor 126 is a magnetic rotor. During operation, the rotor 126 is turned relative to the stator 134, which in turn rotates the substrate support 128, the edge ring 130, and the substrate 132 supported thereon.

During operation, heat retained in the edge ring 130 can cause the temperature at the edge of the substrate 132 to be higher than the temperature at the center of the substrate 132. In some examples, a thickness of the edge ring 130 may be over-sized to provide extra thermal mass to act as a heat sink, which helps avoid overheating the edge of the substrate 132. In some embodiments, a cooling member 143 is located near the edge ring 130 to act as a heat sink for cooling the edge ring 130. The cooling member 143 is disposed on a chamber base 125. The chamber base 125 is coupled to the chamber body 120. The chamber base 125 includes a first surface 171 and a second surface 172 opposite the first surface 171. As shown in FIG. 1, the cooling member 143 is in direct contact with the first surface 171 of the chamber base 125. In some examples, the cooling member 143 may be formed from a material having high heat conductivity (e.g., a metal, such as aluminum or copper, etc. . . . ). A channel 137 is formed in the chamber base 125 for providing a flow of coolant (e.g., water) to the chamber base 125. In operation, coolant supplied to the channel 137 is able to cool the chamber base 125 as well as the cooling member 143 located near the chamber base 125. In one embodiment, which can be combined with other embodiments disclosed herein, it is contemplated that there are multiple cooling channels 137 formed in the chamber base 125.

A fin 140 is formed on the edge ring 130 to provide extra thermal mass. In some examples, the fin 140 may be continuous or discontinuous. In some embodiments, the fin 140 is cylindrical. In some examples, the fin 140 may include a plurality of discrete fins. The fin 140 is formed on a surface of the edge ring 130 that is facing towards the channel 124. As shown in FIG. 1, the fin 140 extends into the channel 124. In some other examples, the fin 140 may be formed on a surface of the edge ring 130 that is facing towards the window 122. In both embodiments, the fin 140 is substantially perpendicular to a plane of the edge ring 130.

Figures 2A, 2B:
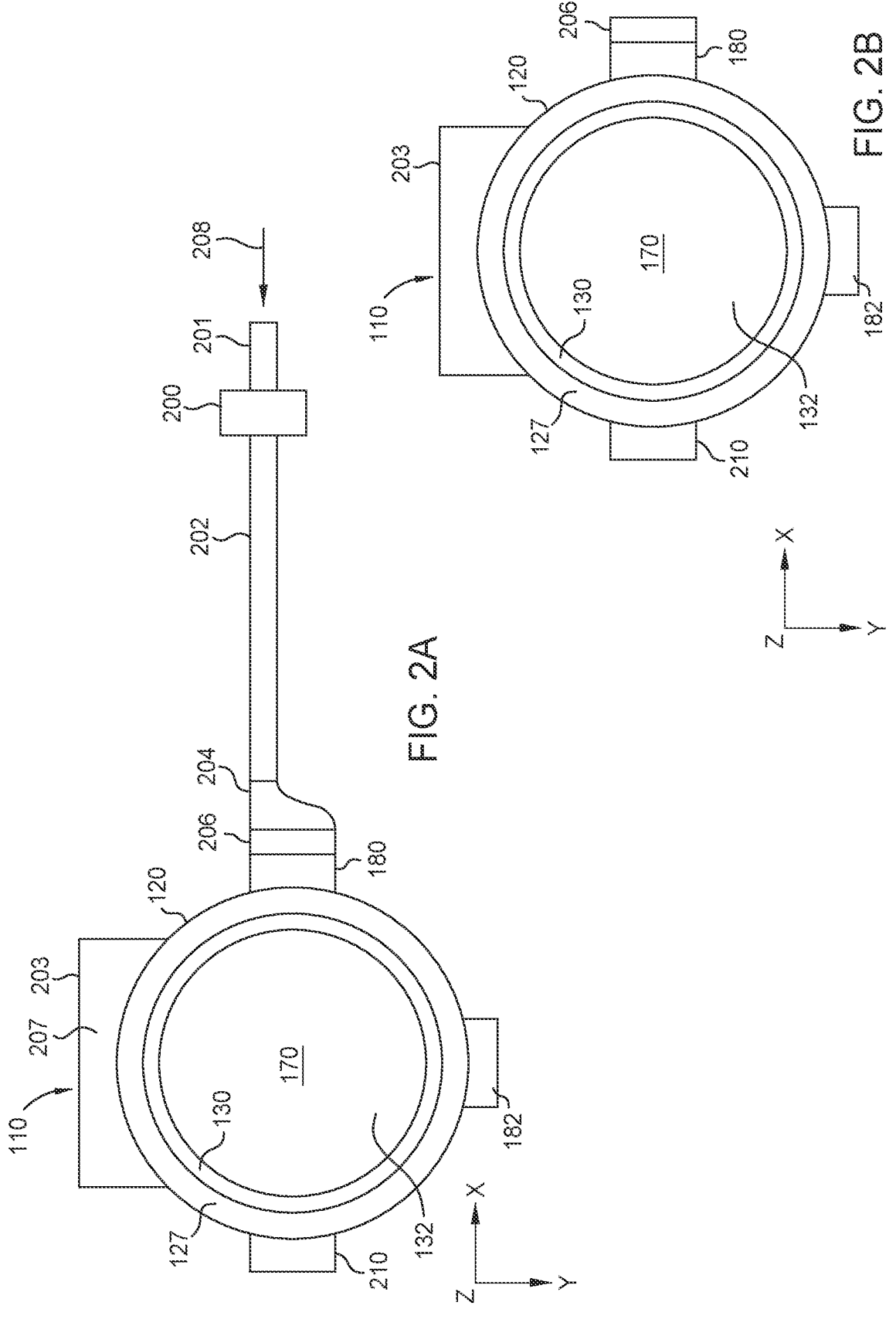
FIG. 2A is a plan view of the process chamber of FIG. 1, according to examples of the present disclosure.
FIG. 2B is a plan view of the process chamber of FIG. 1, according to some embodiments.

FIG. 2A is a plan view of the process chamber 110, according to examples of the present disclosure, showing the process volume 170 of the process chamber 110 with the lamp assembly 116 removed. FIG. 2B is a plan view of the process chamber 110 with the lamp assembly 116 removed, according to some embodiments. As shown in FIG. 2A, the process chamber 110 has a slit valve 203 that allows access into the chamber body 120 through an opening in an outer wall of the chamber body 120. The slit valve 203 may be coupled to a transfer chamber having a transfer robot disposed therein. The slit valve 203 allows the substrate 132 to be loaded into and removed from the process volume in the interior of the chamber body 120 (e.g., using a robotic end effector of the transfer robot). The slit valve 203 is located across from an outlet port 182 formed in the chamber body 120. A door 207 closes over and seals off the opening to allow the environment of the process volume to be controlled independently of ambient conditions outside the chamber body 120.

As shown in FIG. 2A, the slit valve 203 is located 90° counterclockwise from the inlet port 180. The outlet port 182 is located 270° counterclockwise from the inlet port 180. The outlet port 182 is located 180° from the slit valve 203. Therefore, when the substrate 132 is rotated in a counterclockwise direction, gas flow is swept at least 270° around the interior of the chamber body 120 before being exhausted through the outlet port 182. However, the inlet port 180, the outlet port 182, and the slit valve 203 may be positioned at various optional locations relative to each other. In some examples, the outlet port 182 may be located 90° counterclockwise or 180° from the inlet port 180. Similarly, for clockwise rotation, the outlet port 182 may be located 90°, 180°, or 270° clockwise from the inlet port 180. In some examples, the slit valve 203 may be located 180° from the inlet port 180. In some examples, the outlet port 182 and the slit valve 203 may coincide with each other (e.g., being located on the same side of the chamber body 120). In some examples, the outlet port 182 is level on an X-Y plane with the inlet port 180.

As shown in FIG. 2A, a remote plasma source (RPS) 200 is coupled to the process chamber 110 upstream of the inlet port 180. In some examples, the RPS 200 may provide vaporization or plasma generation of precursor gases that are subsequently provided to the process chamber 110 for interacting with the substrate 132. In other examples, there is no RPS 200 connected with the inlet port 180. In an embodiment without the RPS 200, a mixture of inert gas and precursor gas is directly supplied to the process chamber 110 through the inlet port 180. In some examples, the precursor gases may include one or more reactive gases (e.g., water (e.g., $H_2O$) or heavy water (e.g., $D_2O$)) and/or inert gases (e.g., hydrogen (e.g., $H_2$) or argon (e.g., Ar)) (also referred to as "carrier gases"). In some examples, the reactive gases may be vaporized to form steam. The RPS 200 is coupled to a gas supply 208 from a gas panel through a first conduit 201. The RPS 200 is coupled to the inlet port 180 through a second conduit 202. As shown in FIG. 2A, the second conduit 202 has a manifold 204 at a distal end relative to the RPS 200 for providing volume expansion of gas flow leading to the inlet port 180.

Figure 3B:
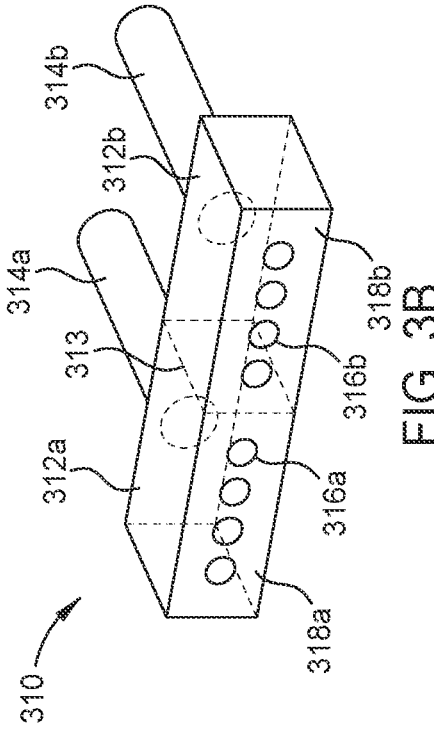
FIGS. 3A-3D are isometric views of various injection modules that may be used in the process chamber of FIG. 1, according to examples of the present disclosure.
Figure 3D:
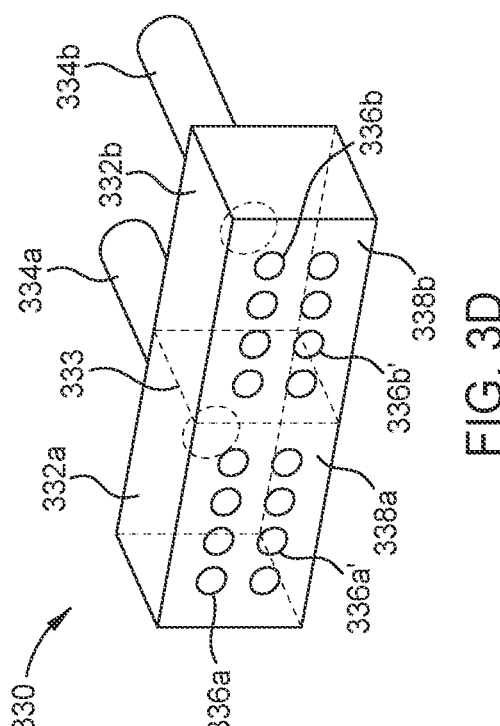
Figure 3A:
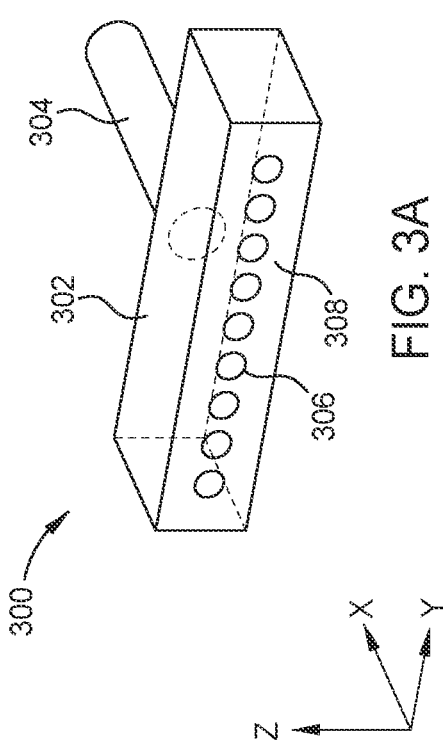
Figure 3C:
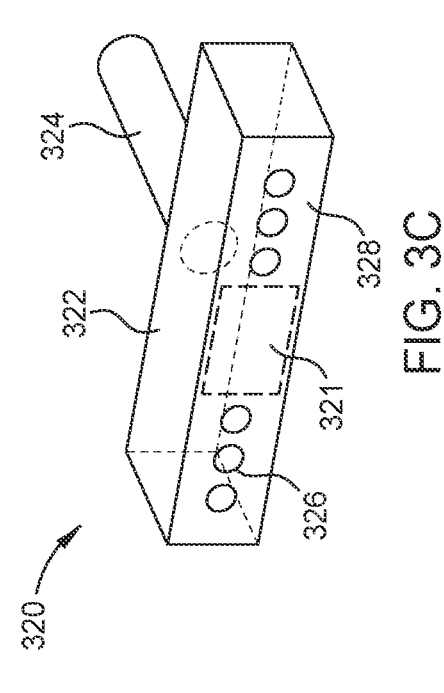

As shown in FIG. 2A, an injection module 206 is coupled between the inlet port 180 and the manifold 204 of the second conduit 202. In some other embodiments, the second conduit 202 is coupled directly to the injection module 206 without the manifold 204 (e.g., as shown in FIGS. 3A and 3C). In some other embodiments, the second conduit 202 is split into multiple different gas flow paths that are independently coupled directly to the injection module 206 without the manifold 204 (e.g., as shown in FIGS. 3B and 3D). The injection module 206 enables control over the rate, distribution, and/or directionality of gas flow to the process chamber 110, as described in more detail below. The injection module 206 may be configured such that the inlet port 180 is substantially coplanar to the second conduit 202 and/or manifold 204, allowing for a decrease in the size of the injection module 206. The planarity of the second conduit 202, the injection module 206, and the inlet port 180 may provide adequate expansion space for the process gas, facilitating more even gas distribution, while minimizing hardware size/space. In contrast, as is done in prior approaches, injected process gases follow non-linear (or non-planar) paths, resulting in turbulent flow and/or uneven gas distribution. To minimize the turbulent flow and/or uneven gas distribution, relatively large manifolds are used in conventional approaches, resulting in larger hardware footprints.

The injection module 206 is configured to manage the gas flow from the second conduit 202 such that the rate, distribution, and/or directionality of the gas flow is within a desired range. In one example, the ratio of the flow rate of gas exiting from the injection module 206 to the rotational spin rate of the substrate support is between about one-third and about three, such as between about one-half and about two. If the ratio of the flow rate of gas exiting from the injection module 206 to the rotational spin rate of the substrate support is too low, then the precursor gas may be unable to reach the center of the substrate, and, thus, unable to displace the gas in the stagnation region proximal to the center of the substrate 132, possibly resulting in non-uniform deposition. If the ratio of the flow rate of gas exiting from the injection module 206 to the rotational spin rate of the substrate support is too high, then the precursor gas may overshoot the stagnation region proximal to the center of the substrate 132, possibly resulting in non-uniform deposition. In some examples, gas flow into the process chamber 110 may include a combined mixture of two or more gases. In one example, gas flow may include a mixture of hydrogen and water (e.g., steam). In another example, gas flow may include a mixture of argon and water (e.g., steam).

In some embodiments, the controller 176 (FIG. 1) is configured to control a flow rate of gas exiting from the injection module 206. In some embodiments, the controller

176 is configured to control a rotational spin rate of the substrate support. In some embodiments, the controller 176 is configured to control a pressure of the process volume. In some embodiments, the controller is configured to control a ratio of the flow rate of gas exiting from the injection module 206 to the rotational spin rate of the substrate support, for example, setting and/or maintaining the ratio between about one-third and about three, such as between about one-half and about two. The controller 176 generally includes the one or more processors, memory, and support circuits. The one or more processors may include a central processing unit (CPU) and may be one of any form of a general purpose processor that can be used in an industrial setting. The memory, or non-transitory computer-readable medium, is accessible by the one or more processors 184 and may be one or more of memory such as random access memory (RAM), read only memory (ROM), floppy disk, hard disk, or any other form of digital storage, local or remote. The support circuits are coupled to the one or more processors and may comprise cache, clock circuits, input/output subsystems, power supplies, and the like. The various methods disclosed herein may generally be implemented under the control of the one or more processors by the one or more processors executing computer instruction code stored in the memory as, for example, a software routine. When the computer instruction code is executed by the one or more processors, the one or more processors controls the chamber 100 to perform processes in accordance with the various methods.

As shown in FIGS. 2A-2B, an additional inlet port 210 is formed in the chamber body 120. The positions of the outlet port 182 and the inlet port 210 are interchangeable. In some embodiments, gas flow occurs through both inlet ports 180, 210 simultaneously or at different intervals during the same process. The inlet port 210 may be located 90, 180, or 270 degrees counterclockwise from the outlet port 182. Gas flow through the inlet port 210 may be controlled using an injection module set forth herein. For example, each inlet port 180, 210 may have an injection module with a single gas inlet (shown in FIGS. 3A and 3C) or multiple gas inlets (shown in FIGS. 3B and 3D). In one example, only inlet port 180 has an injection module with a single gas inlet. In another example, only inlet port 180 has an injection module with multiple gas inlets. In another example, each inlet port 180, 210 has an injection module with a single gas inlet. In yet another example, each inlet port 180, 210 has an injection module with multiple gas inlets.

FIGS. 3A-3D are isometric views of various injection modules that may be used in the process chamber 110, according to examples of the present disclosure. The embodiments of FIGS. 3A-3D may be combined with other embodiments disclosed herein. FIG. 3A illustrates an injection module 300 having a body 302, a single gas inlet 304, configured to couple to the body 302, and a plurality of nozzles 306 formed in a supply face 308 of the body 302. The supply face 308 is configured to face the interior of the process chamber 110 when in operation. The plurality of nozzles 306 have a pitch defined by the horizontal distance between the centers of adjacent nozzles 306. As shown in FIG. 3A, the nozzles 306 are aligned in a vertical (Z) direction. In other words, the nozzles 306 are located on the same horizontal (X-Y) plane. In some embodiments, the body 302, the gas inlet 304, and the nozzles 306 are configured to be coplanar (i.e., in the same plane, here the X-Y plane) with the second conduit 202 (shown in FIG. 2A). In some other embodiments, one or more of the body 302, the gas inlet 304, the nozzles 306, or combinations thereof are not aligned in the same plane with the second conduit 202. The supply face 308 is configured to be perpendicular to a plane of the edge ring 130 and perpendicular to a surface of the substrate 132 contacting the edge ring 130. In some examples, a vertical spacing (measured in the Z direction) between the surface of the substrate 132 and the nozzles 306 may be within a range of about 5 mm to about 15 mm, such as about 10 mm.

As previously discussed, it is currently believed that high convective drag forces may impede migration of fresh reactants to the center of the rotating substrate. Embodiments disclosed herein address this challenge with increased gas flow rates (relative to the rotational spin rate of the substrate) and with improved gas flow directionality. For example, as illustrated in FIGS. 3A-3D, the configuration of the plurality of nozzles formed in the supply face of the injection module may facilitate migration of fresh reactants towards the center of the rotating substrate, crossing the rotational convective drag forces.

The number, size, pitch, and planarity of nozzles 306 is not to be limited by that which is shown in the Figures. In one example, the number of the nozzles 306 formed in the supply face 308 may differ from the number shown in FIG. 3A. For instance, 3, 4 or 5 nozzles 306 may be formed in the supply face 308. In one example, the size of each of the nozzles 306 formed in the supply face 308 may differ. For instance, each of the nozzles may have a diameter between 20 mils and 100 mils, such as about 30 mils or 80 mils. In one example, each of the nozzles 306 may have a different size, pitch, and planarity.

FIG. 3B illustrates an injection module 310 having more than one injection zone. The injection module 310 has two body portions 312a-b that are separated from each other by a vertical partition 313. As shown in FIG. 3B, the vertical partition 313 is perpendicular to the X-Z plane. The vertical partition 313 is at or near a horizontal center (measured in the Y-direction) between the two body portions 312a-b. The injection module 310 has two separate and independent gas inlets 314a-b. Alternatively, in some embodiments, multiple body portions (e.g. 312a-b) may be couple with a single gas inlet. As illustrated, a first gas inlet 314a is coupled to the first body portion 312a, and a second gas inlet 314b is coupled to the second body portion 312b. Similar to FIG. 3A, a plurality of nozzles 316a-b are formed in a corresponding supply face 318a-b of each body portion 312a-b. However, in contrast to FIG. 3A, first and second groups of nozzles 316a-b of each body portion 312a-b are fluidly coupled to only the corresponding gas inlet 314a-b. In FIG. 3B, spacing between the pair of nozzles proximate the partition 313 is greater compared to spacing between other adjacent pairs of nozzles. In some other examples, spacing between each adjacent pair of nozzles is equal for all nozzles, or in other words, the nozzles have uniform pitch.

In some embodiments, the two separate body portions 312a-b, the gas inlets 314a-b, and the nozzles 316a-b are configured to be coplanar (i.e., in the same plane, here the X-Y plane) with the second conduit 202 (shown in FIG. 2A). In some other embodiments, one or more of the body portions 312a-b, the gas inlets 314a-b, the nozzles 316a-b, or combinations thereof are not aligned in the same plane with the second conduit 202.

In some other examples, the injection module 310 may have more than two injection zones including more than two body portions, separate gas inlets corresponding to each body portion, and a partition between each adjacent body portion. In some examples, the body portions may have the same or different widths. In some examples, the number of separate gas inlets may be the same, greater, or less than the number of injection zones or separate body portions. In some examples, the injection module 310 may have two to seven separate injection zones, such as two, three, four, five, six, or seven separate injection zones. In some examples, the first and second groups of nozzles 316a-b may have one to seven individual nozzles, such as one, two, three, four, five, six, or seven individual nozzles. Gas flow through each injection zone may be controlled independently (e.g., using a proportional control valve on each gas inlet 314a-b). Independent control of gas flow through each injection zone may enable better control of gas flow rate, distribution, and/or directionality within the process chamber 110, thereby improving gas flux and reaction uniformity across the surface of the substrate 132.

FIG. 3C illustrates an injection module 320 having a low flow region, or "void area." The injection module 320 is similar to FIG. 3A, having a body 322, a single gas inlet 324 coupled to the body 322, and a plurality of nozzles 326 formed in a supply face 328 of the body 322. However, in contrast to FIG. 3A, the supply face 328 has a void area 321 (inside the dashed line) with a larger spacing between proximate adjacent nozzles, compared to spacing between other adjacent pairs of nozzles. In some examples, the spacing between proximate adjacent nozzles in the void area 321 may be about 2× to about 10× greater than spacing between other adjacent pairs of nozzles, such as about 5× greater, as shown. In some other examples, the supply face 328 may have two or more separate void areas between groups of nozzles with closer spacing.

As shown in FIG. 3C, the void area 321 is located at or near a horizontal center (measured in the Y-direction) of the supply face 328. Also as illustrated, the void area 321 is overlapping (e.g., aligned with) the gas inlet 324. When the void area 321 overlaps the gas inlet 324, as shown in FIG. 3C, distribution of gas flow through the remaining nozzles 326 is improved. In other words, by blocking straight-line gas flow through one or more nozzles that would otherwise be overlapping the gas inlet 324, gas flow distribution through the remaining nozzles 326 is more uniform. In some other embodiments, baffles or a diffuser plate may be disposed in the body 322 to improve gas flow distribution and/or increase gas flow uniformity through the nozzles.

Another advantage of including the void area 321 proximate the horizontal center of the supply face 328 is to direct relatively higher gas flow towards a radial edge of the substrate 132, compared to a radial center of the substrate 132, for example, when higher gas flow at the radial edge is desired. In some other examples, the void area 321 may be located proximate a horizontal edge of the supply face 328, for example, when higher gas flow at the radial center of the substrate 132 is desired.

FIG. 3D illustrates an injection module 330 having nozzles arrayed in two different directions on the supply face 328 (i.e., along the Y-Z plane). Similar to FIG. 3B, the injection module 330 has two body portions 332a-b that are separated from each other by a vertical partition 333. The vertical partition 333 is at or near a horizontal center (measured in the Y-direction) between the two separate body portions 332a-b. The injection module 330 has two separate and independent gas inlets 334a-b. A first gas inlet 334a is coupled to the first body portion 332a, and a second gas inlet 334b is coupled to the second body portion 332b. Similar to FIG. 3B, a plurality of nozzles are formed in a corresponding supply face 338a-b of each body portion 332a-b facing the interior of the process chamber 110. However, in contrast to FIG. 3B, the plurality of nozzles are arrayed in both the vertical (Z) and horizontal (Y) directions on the supply face. A first group of nozzles of the first body portion 332a has an upper row 336a and a lower row 336a'. Likewise, a second group of nozzles of the second body portion 332b has an upper row 336b and a lower row 336b'. The stacked arrangement of nozzles increases gas flow distribution in the vertical (Z) direction. In some examples, each group of nozzles may have two to nine rows, such as two, three, four, five, six, seven, eight, or nine rows. In some examples, each group of nozzles may have the same or different numbers of rows. In some examples, the nozzles in FIGS. 3A-3D may have uniform or non-uniform pitch or spacing. In some examples, the number of nozzles in each body portion may be the same or different. In some examples, the nozzles may be the same or different sizes.

In some examples, either of the injection modules with multiple gas inlets (shown in FIGS. 3B and 3D) may have a void area similar to FIG. 3C to selectively control gas flow in relation to the substrate.

FIGS. 4A-4D are cross-sectional views of various injection modules 400a-d that may be used in the process chamber 110, according to examples of the present disclosure, which may be combined with other embodiments disclosed herein. FIGS. 4A-4D illustrate a body 402, a single gas inlet 404 coupled to the body 402, and a plurality of nozzles 406 formed in a supply face 408 of the body 402. FIG. 4A is a top cross-sectional view of an injection module 400a. As shown in FIG. 4A, the nozzles 406a are oriented perpendicular to the supply face 408 (also referred to as "straight nozzles"). The nozzles 406a are parallel to each other in the X direction.

FIG. 4B is a top cross-sectional view of an injection module 400b. As shown in FIG. 4B, the nozzles 406b are oriented at an angle other than perpendicular to the supply face 408 and to the X direction (also referred to as "angled nozzles"). In FIG. 4B, the nozzles 406b are configured to be angled towards a counterclockwise direction (−Y direction) in relation to the substrate 132 (FIG. 2B). In some other examples, the nozzles 406b may be configured to be angled in a clockwise direction (+Y direction) in relation to the substrate 132 (FIG. 2B). In some examples, the angle of the nozzles 406b measured from perpendicular to the supply face 408 in the +Y or −Y direction may be within a range of about 0° to about 80° in either direction, such as about 0° to about 60°, such as about 0° to about 45°, such as about 0° to about 30°, such as about 0° to about 15°, or about 15° to about 75°, such as about 30° to about 60°, such as about 30°, about 45°, or about 60° in either direction. In FIG. 4B, the angled nozzles 406b are parallel to each other, thus having the same angle with the supply face 408. In some other embodiments, the angled nozzles 406b may be oriented at different angles from each other. The remaining nozzles 406a are oriented perpendicular to the supply face 408, similar to FIG. 4A. In some other embodiments, the straight and angled nozzles may be combined in various arrangements depending on the application. For example, the straight and angled nozzles may be arranged in a pattern, such as an alternating pattern.

FIG. 4C is a side cross-sectional view of an injection module 400c with nozzles arrayed in two different directions on the supply face (e.g., as shown in FIG. 3D). As shown in FIG. 4C, the nozzles 406c are straight nozzles, being oriented perpendicular to the supply face 408. The nozzles 406c are parallel to each other in the X direction.

FIG. 4D is a side cross-sectional view of an injection module 400d with nozzles arrayed in two different directions on the supply face (e.g., as shown in FIG. 3D). As shown in FIG. 4D, at least some of the nozzles are angled in relation to the supply face 408 and to the X direction (also referred to as "angled nozzles"). In other words, the nozzles are inclined relative to the horizontal (X-Y) plane. The nozzle 406d is configured to be angled upwards (+Z direction) away from the substrate 132 (FIG. 2B). The nozzle 406e is configured to be angled downwards (−Z direction) towards the substrate 132 (FIG. 2B). In some examples, the angle of the nozzles 406d-e measured from perpendicular to the supply face 408 in the +Z or −Z direction may be within a range of about 0° to 80° in either direction, such as about 0° to about 60°, such as about 0° to about 45°, such as about 0° to about 30°, such as about 0° to about 15°, or about 15° to about 75°, such as about 30° to about 60°, such as about 30°, about 45°, or about 60° in either direction. The remaining nozzles 406c are oriented perpendicular to the supply face 408, similar to FIG. 4C. In some other embodiments, the straight and angled nozzles may be combined in various arrangements depending on the application. For example, the straight and angled nozzles may be arranged in a pattern, such as an alternating pattern.

Figure 4E:
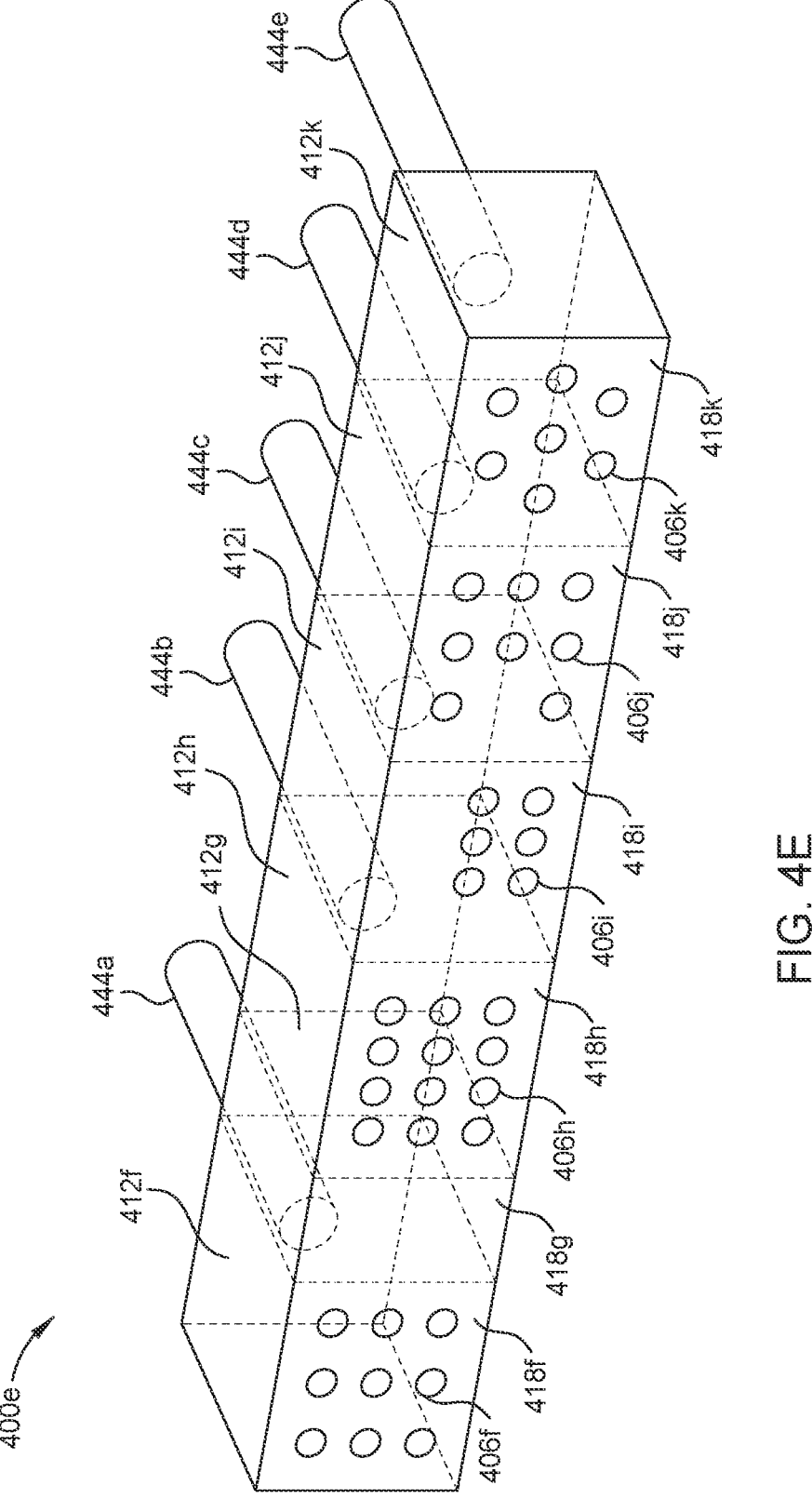
FIG. 4E is a schematic isometric view of an injection module that may be used in the process chamber of FIG. 1, according to examples of the present disclosure.

FIG. 4E is an isometric front view of an injection module 400e with a plurality of nozzles 406f-k formed in a corresponding supply face 418f-k of each body portion 412f-k. As shown in FIG. 4E, the number, size, pitch, and planarity of nozzles 406f-k on each corresponding supply face 418f-k may be the same or different. In some embodiments, the size, pitch, and/or planarity of nozzles 406f-k on each corresponding supply face 418f-k may be the same or different than the adjacent nozzle 406f-k. The number of gas inlets 444a-e may be the same as, more than, or less than the number of body portions 412f-k. In some embodiments, multiple body portions 412f-k may share a single gas inlet 444a-e. In some embodiments, which can be combined with other embodiments described herein, a single body portion 412f-k may have multiple gas inlets 444a-e. Although each of the nozzles 406f-k are shown perpendicular to the corresponding supply face 418f-k, it is contemplated that, in some embodiments, one or more of the nozzles 406f-k are angled with respect to the corresponding supply face 418f-k. In the embodiment where one or more of the nozzles 406f-k are angled with respect to the corresponding supply face 418f-k, the nozzles 406f-k may be pointed in at least two or more directions.

While the foregoing is directed to embodiments of the present disclosure, other and further embodiments of the disclosure may be devised without departing from the basic scope thereof, and the scope thereof is determined by the claims that follow.

What is claimed is:

1. A process chamber suitable for use in semiconductor manufacturing, comprising:
   a chamber body comprising a sidewall portion and a lower portion;
   a chamber base coupled to the chamber body;
   an annular channel formed in the chamber body and disposed around the chamber base, the annular channel comprising an outer wall and an inner wall;
   a rotatable substrate support disposed inside a process volume of the chamber body, the substrate support configured to support a single substrate and have a rotational spin rate;
   a window disposed on the sidewall portion above the rotatable substrate support;
   a rapid annealing lamp assembly disposed over the window and the rotatable substrate support;
   an inlet port formed in the chamber body; and an injection module coupled to the inlet port, the injection module having:

a body;

one or more gas inlets coupled to the body; and a plurality of nozzles formed in a supply face of the body, each nozzle of the plurality of nozzles located on the same horizontal plane with one another and parallel with an upper surface of the rotatable substrate support, the supply face configured to face inside the chamber body, wherein gas exiting from the injection module passes through the inlet port to enter the process volume, and the gas exiting from the injection module is configured to have a flow rate; and a controller configured to operate the process chamber such that the ratio of the flow rate to the rotational spin rate is between about ⅓ meters per second/Hertz and 3 meters per second/Hertz.

2. The process chamber of claim 1, further comprising an outlet port formed in the chamber body, wherein the outlet port is located 270° counterclockwise from the inlet port.

3. The process chamber of claim 1, wherein:

the substrate support is configured to have a rotational spin rate of greater than or equal to about 2 Hertz, the process volume is configured to have a pressure of at least about 100 Torr, and the controller is configured to operate the process chamber such that the ratio of the flow rate to the rotational spin rate is between about ½ meters per second/Hertz and 2 meters per second/Hertz.

4. The process chamber of claim 3, wherein the plurality of nozzles are perpendicular to the supply face.

5. The process chamber of claim 1, further comprising:

a second inlet port formed in the chamber body; and a second injection module coupled to the second inlet port.

6. A process chamber, comprising:

a chamber body comprising a sidewall portion;

a chamber base coupled to the chamber body;

an annular channel formed in the chamber body and disposed around the chamber base, the annular channel comprising an outer wall and an inner wall;

a rotatable substrate support disposed inside a process volume of the chamber body, the substrate support configured to support a single substrate and have a rotational spin rate;

a window disposed on the sidewall portion above the rotatable substrate support;

a rapid annealing lamp assembly disposed over the window and the rotatable substrate support;

an inlet port formed in the sidewall portion of the chamber body; and an injection module coupled to the inlet port, the injection module having:

a body;

one or more gas inlets coupled to the body; and a plurality of nozzles formed in a supply face of the body, each nozzle of the plurality of nozzles located on the same horizontal plane with one another and parallel with and upper surface of the rotatable substrate support, the supply face configured to face inside the chamber body, and gas exiting from the injection module configured to have a flow rate; and a controller configured to operate the process chamber such that the ratio of the flow rate to the rotational spin rate is between about ⅓ meters per second/Hertz and 3 meters per second/Hertz.

7. The process chamber of claim 6, further comprising an outlet port formed in the chamber body, wherein the outlet port is level on an X-Y plane with the inlet port.

8. The process chamber of claim 7, wherein the outlet port is located 270° counterclockwise from the inlet port.

9. The process chamber of claim 6, wherein:

the substrate support is configured to have a rotational spin rate of greater than or equal to about 2 Hertz, the process volume is configured to have a pressure of at least about 100 Torr, and the controller is configured to operate the process chamber such that the ratio of the flow rate to the rotational spin rate is between about ½ meters per second/Hertz and 2 meters per second/Hertz.

10. The process chamber of claim 6, wherein the plurality of nozzles are perpendicular to the supply face.

11. The process chamber of claim 6, wherein the supply face of the injection module is perpendicular to the rotatable substrate support.

12. The process chamber of claim 6, wherein each nozzle of the plurality of nozzles has a diameter between 20 mils and 100 mils.

13. A process chamber, comprising:

a chamber body comprising a sidewall portion and a lower portion;

a chamber base coupled to the chamber body;

an annular channel formed in the chamber body and disposed around the chamber base, the annular channel comprising an outer wall and an inner wall;

a rotatable substrate support disposed inside a process volume of the chamber body, the substrate support configured to support a single substrate and have a rotational spin rate;

a window disposed on the sidewall portion above the rotatable substrate support;

a rapid annealing lamp assembly disposed over the window and the rotatable substrate support;

an inlet port formed in the chamber body;

a conduit for conveying gases into the process volume through the inlet port; and an injection module coupled between the inlet port and the conduit, the injection module having:

a body;

one or more gas inlets coupled to the body; and a plurality of nozzles formed in a supply face of the body, each nozzle of the plurality of nozzles located on the same horizontal plane with one another and parallel with an upper surface of the rotatable substrate support, the supply face configured to face inside the chamber body, and gas exiting from the injection module configured to have a flow rate; and a controller configured to operate the process chamber such that the ratio of the flow rate to the rotational spin rate is between about ⅓ meters per second/Hertz and 3 meters per second/Hertz.

14. The process chamber of claim 13, wherein the inlet port, the conduit, and the injection module are coplanar.

15. The process chamber of claim 13, wherein the body of the injection module, the plurality of nozzles, and the one or more gas inlets are coplanar.

16. The process chamber of claim 13, further comprising a manifold disposed between the conduit and the injection module.

17. The process chamber of claim 13, further comprising an outlet port formed in the chamber body, wherein the outlet port is level on an X-Y plane with the inlet port.

18. The process chamber of claim 17, wherein the outlet port is located 270° counterclockwise from the inlet port.

19. The process chamber of claim 13, wherein the supply face of the injection module is perpendicular to the rotatable substrate support.

20. The process chamber of claim 1, wherein the rotatable substrate support is disposed between the outer wall and the inner wall of the annular channel.

\* \* \* \* \*